(12) United States Patent
Higuchi et al.

(10) Patent No.: US 7,279,823 B2
(45) Date of Patent: Oct. 9, 2007

(54) PIEZOELECTRIC ACTUATOR AND LIQUID JET HEAD

(75) Inventors: Takamitsu Higuchi, Nagano-ken (JP); Setsuya Iwashita, Nagano-ken (JP); Koji Sumi, Nagano-ken (JP); Masami Murai, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 356 days.

(21) Appl. No.: 10/492,355

(22) PCT Filed: May 15, 2003

(86) PCT No.: PCT/JP03/06074

§ 371 (c)(1),
(2), (4) Date: Apr. 13, 2005

(87) PCT Pub. No.: WO03/098714

PCT Pub. Date: Nov. 27, 2003

(65) Prior Publication Data

US 2005/0179342 A1    Aug. 18, 2005

(30) Foreign Application Priority Data

May 15, 2002    (JP) ............................ 2002-140558

(51) Int. Cl.
*H01L 41/08* (2006.01)
(52) U.S. Cl. .................. 310/324; 310/331; 310/358
(58) Field of Classification Search ............... 310/324, 310/328, 330–332, 358; 371/68–72
See application file for complete search history.

(56) References Cited

U.S. PATENT DOCUMENTS

| | | | | |
|---|---|---|---|---|
| 5,179,070 A | * | 1/1993 | Harada et al. .............. | 505/235 |
| 5,529,981 A | * | 6/1996 | Holloway .................. | 505/400 |
| 5,889,289 A | * | 3/1999 | Cukauskas et al. ......... | 257/33 |
| 6,242,387 B1 | * | 6/2001 | Cukauskas et al. ......... | 505/411 |
| 7,183,440 B2 | * | 2/2007 | Roberts et al. .............. | 568/18 |

FOREIGN PATENT DOCUMENTS

| JP | 2001-509312 A | 7/2001 |
|---|---|---|
| JP | 2001-237467 A | 8/2001 |
| JP | 2003-163176 A | 6/2003 |

(Continued)

OTHER PUBLICATIONS

D. K. Fork et al.., "Epitaxial yttria-stabilized zirconia on hydrogen-terminated Si by pulsed laser deposition" In: Applied Physics Letters: American Institute of Physics, Sep. 10, 1990, vol. 57, No. 11, pp. 1137 to 1139.

R. Haakenaasen et al., "High quality crystalline $YBa_2Cu_3O_{7-\delta}$ films on thin silicon substrates", In: Applied Physics Letters: American Institute of Physics, Mar. 21, 1994, vol. 64, No. 12, pp. 1573 to 1575.

(Continued)

*Primary Examiner*—Mark Budd
(74) *Attorney, Agent, or Firm*—Sughrue Mion, PLLC

(57) ABSTRACT

A piezoelectric actuator comprising an optimum layer structure when (100) orientation strontium ruthenate is used as a bottom electrode is provided. This piezoelectric actuator comprises a diaphragm 30 that is constituted by (100) orientation yttria-stabilized zirconia, $CeO_2$, or $ZrO_2$, that is grown epitaxially on a (100) orientation Si substrate 20, a buffer layer 41 formed on the diaphragm and constituted by (001) orientation $REBa_2Cu_3O_x$, a bottom electrode 42 formed on the buffer layer and constituted by (100) orientation strontium ruthenate, a piezoelectric layer 43 formed on the bottom electrode and constituted by (100) orientation PZT, and a top electrode 44 formed on the piezoelectric layer.

6 Claims, 4 Drawing Sheets

FOREIGN PATENT DOCUMENTS

JP       2003179279 A    6/2003
JP       2003-209303 A   7/2003

OTHER PUBLICATIONS

S. Y. Hou et al., "Structure and properties of epitaxial $Ba_{0.5}Sr_{0.5}TiO_3RuO_3/ZrO_2$ heterostructure on Si grown by off-axis sputtering"In: Applied Physic Letters: American Institute of Physics, Sep. 4, 1995, vol. 67, No. 10, pp. 1387 to 1389.

A. Abrutis et al., Deposition of $SrRuO_3$ films and $SrRuO_3/YBa_2Cu_3O_7$ heterostructures by pulsed injection MOCVD In Journal de Physique IV: EDP Sciences, 2001, vol. 11, p. Pr3-1169-1173.

Tenko Higuchi et al., "PLD-ho ni yoru Giripposho (100) $SrRuO_3$ Epitaxial Usumaku no Si Kibanjo eno SakuseilV", Dai 63 Kai Oyo-Butsuri Gkkai Gakujutsu Koenkai Koen Koyoshu, Sep. 24, 2002, separate vol. 2, p. 531.

* cited by examiner

INKJET RECORDING HEAD

- 44; TOP ELECTRODE
- 43; PIEZOELECTRIC THIN FILM
- 42; BOTTOM ELECTRODE
- 40; PIEZOELECTRIC THIN FILM ELEMENT
- 41; BUFFER LAYER
- 30; DIAPHRAGM
- 20; INK CHAMBER SUBSTRATE (Si SUBSTRATE)
- 10; NOZZLE PLATE
- 21; INK CHAMBER
- 11; NOZZLE HOLE
- 22; SIDE WALL

S7

S8

S9

PIEZOELECTRIC ACTUATOR AND LIQUID JET HEAD

TECHNICAL FIELD

The present invention relates to a piezoelectric actuator comprising a piezoelectric body and a pair of electrodes disposed on either side of the piezoelectric body, and more particularly to a piezoelectric actuator containing strontium ruthenate as a bottom electrode.

BACKGROUND ART

A piezoelectric actuator comprises a piezoelectric element in which a piezoelectric film having an electromechanical transducing function is interposed between two electrodes, the piezoelectric film being constituted by a crystallized piezoelectric ceramic. A compound oxide having a perovskite crystalline structure which can be expressed by the chemical formula $ABO_3$ is known as such a piezoelectric ceramic. As an example, lead zirconate titanate (PZT), in which lead (Pb) is applied to the zirconate titanate (PZT), in which lead (Pb) is applied to the A and a mixture of zirconium (Zr) and titanium (Ti) is applied to the B, is known.

Conventionally, Pt has been used as the electrode material of a PZT-type piezoelectric element. Pt has a face-centered cubic lattice (FCC) structure, which is a most densely-packed structure, and hence has a strong self-orientation property such that when deposited on an amorphous material such as $SiO_2$, the Pt is strongly oriented in (111) orientation and the orientation quality of the piezoelectric film thereabove improves. However, there is a problem in that due to the strong orientation property, columnar crystals grow, causing Pb and so on to become likely to diffuse along the grain boundary of the lower base. A problem also occurs in relation to the adhesiveness of Pt and $SiO_2$.

When Ti is used to improve the adhesiveness between Pt and $SiO_2$, and TiN or the like is used as a barrier layer to prevent the diffusion of Pb and the like, the electrode structure becomes complicated, causing oxidation of the Ti, diffusion of the Ti into the Pt, and a resultant deterioration in the crystallinity of the PZT. As a result, electrical characteristics such as the piezoelectric characteristic deteriorate.

Since such problems exist in Pt electrodes, research is being conducted in the fields of ferroelectric memory and so on into the use of conductive oxide electrode materials such as $RuO_x$ or $IrO_2$. Among these materials, strontium ruthenate has the same perovskite crystalline structure as PZT, and hence has an excellent bonding property at the interface, facilitates the epitaxial growth of PZT, and also exhibits an excellent characteristic as a Pb diffusion barrier layer.

However, when strontium ruthenate is used as the bottom electrode of a piezoelectric element, the substance which constitutes the layer therebelow must satisfy a physical property as a diaphragm and a chemical property for appropriately controlling the orientation of the strontium ruthenate and ensuring adhesiveness with the substrate and bottom electrode.

DISCLOSURE OF THE INVENTION

An object of the present invention is to provide a piezoelectric actuator comprising an optimum layer structure when strontium ruthenate having a (100) orientation is used as a bottom electrode. A further object is to provide a liquid jetting head comprising this piezoelectric actuator.

A piezoelectric actuator according to the present invention comprises a diaphragm that is constituted by yttria-stabilized zirconia, $CeO_2$, or $ZrO_2$, that is grown epitaxially on a (100) orientation Si substrate in a cubic (100) orientation having a fluorite structure, a buffer layer formed on the diaphragm and constituted by tetragonal or orthorhombic (001) orientation $REBa_2Cu_3O_x$ having a layered perovskite structure (RE=La, Ce, Pr, Nd, Pm, Sm, Eu, Gd, Tb, Dy, Ho, Er, Tm, Yb, Lu, Y), a bottom electrode formed on the buffer layer and constituted by pseudo-cubic (100) orientation strontium ruthenate having a perovskite structure, a piezoelectric layer formed on the bottom electrode and having a rhombohedral (100) orientation perovskite structure, and a top electrode formed on the piezoelectric layer.

In this piezoelectric actuator, the bottom electrode preferably comprises at least two layers of strontium ruthenate and a layer of iridium or platinum interposed therebetween. Thus, in comparison to a bottom electrode constituted by SRO alone, tenacity is improved and breakage and cracking can be suppressed.

In this piezoelectric actuator, of the strontium ruthenate constituting the bottom electrode, at least the layer on the piezoelectric layer side preferably has a composition expressed by $SrRuO_3$. Thus conductivity as a bottom electrode and orientation control of the piezoelectric film can be sufficiently ensured.

In this piezoelectric actuator, the piezoelectric layer is preferably PZT, PMN-PT, or PZN-PT. These piezoelectric bodies ensure a favorable piezoelectric characteristic, and enable favorable orientation control above the bottom electrode constituted by strontium ruthenate.

A liquid jetting head of the present invention comprises the piezoelectric actuator described above, and a pressure chamber constituted on the aforementioned Si substrate and having a capacity which is variable in accordance with the oscillation of the diaphragm comprised in the piezoelectric actuator.

A liquid jetting device of the present invention comprises the liquid jetting head described above as liquid jetting means.

Figure 1:
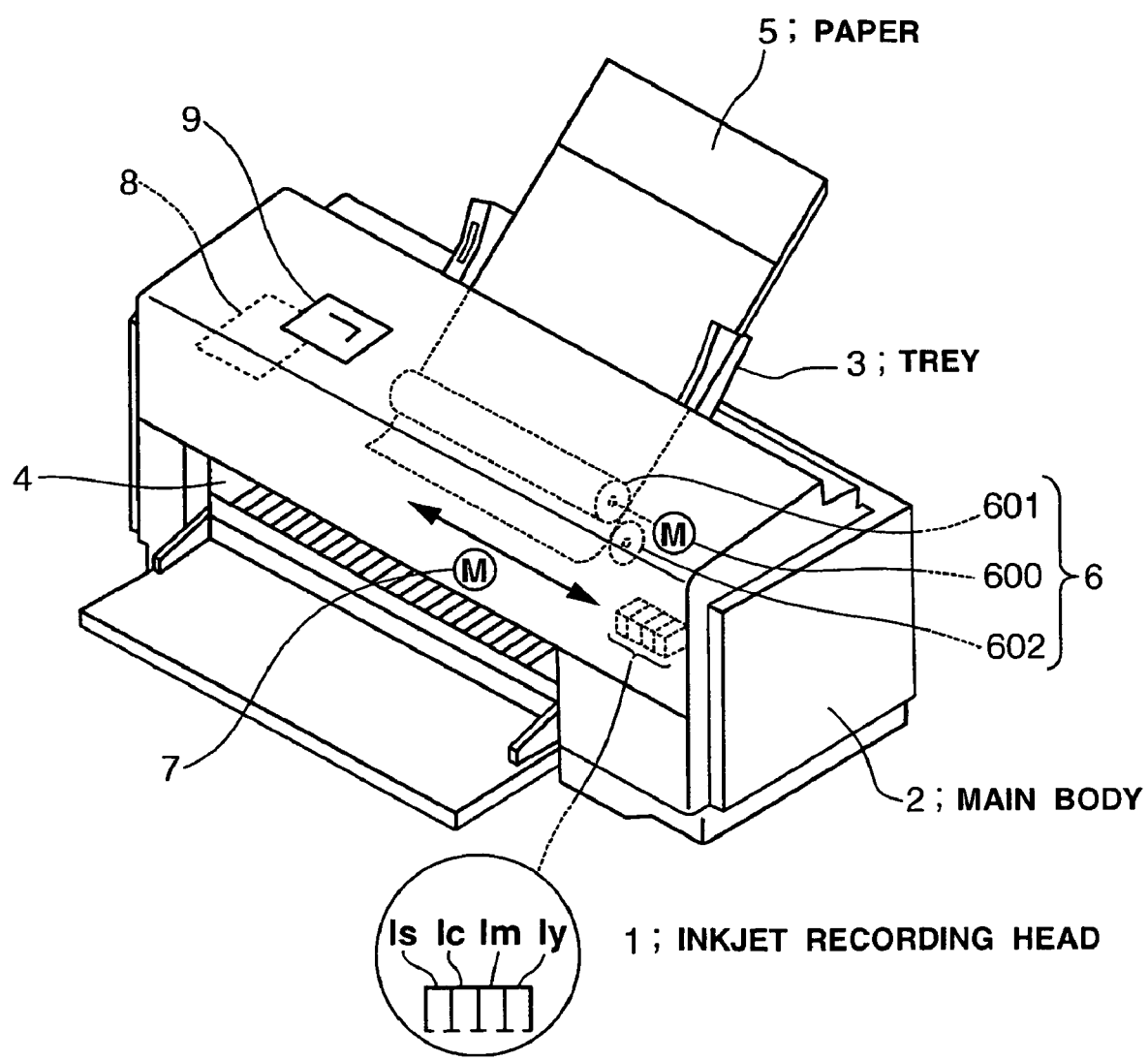
FIG. 1 is a constitutional diagram of an inkjet printer serving as a liquid jetting device comprising a piezoelectric actuator according to an embodiment of the present invention.

Note that in the drawings, the reference symbol 20 refers to a pressure chamber substrate (Si substrate), 30 to a diaphragm, 42 to a bottom electrode, 43 to a piezoelectric thin film, 44 to a top electrode, 21 to a pressure chamber, 10 to a nozzle plate, and 11 to a nozzle.

BEST MODE FOR CARRYING OUT THE INVENTION (Overall Constitution of Inkjet Printer)

FIG. 1 is a constitutional diagram of an inkjet printer which is one example of a liquid jetting device comprising a piezoelectric actuator according to an embodiment of the present invention. The inkjet printer mainly comprises an inkjet recording head 1 serving as an example of the liquid jetting head of the present invention, a main body 2, a tray 3, and a head driving mechanism 7.

The inkjet recording head 1 comprises cartridges storing a total of four colored inks, yellow, magenta, cyan, and black, as liquids to be discharged, and is thus capable of full color printing. This inkjet printer also comprises in its interior a special controller board or the like, by means of which ink discharge timing from the inkjet recording head 1 and scanning of the head driving mechanism 7 are controlled.

A tray 3 is provided on the back face of the main body 2, and an auto sheet feeder (automatic continuous paper supply mechanism) 6 is provided in the interior of the main body 2 for automatically feeding paper 5 and discharging this paper 5 from a discharge port 4 on the front face.

(Overall Constitution of Inkjet Recording Head)

Figure 2:
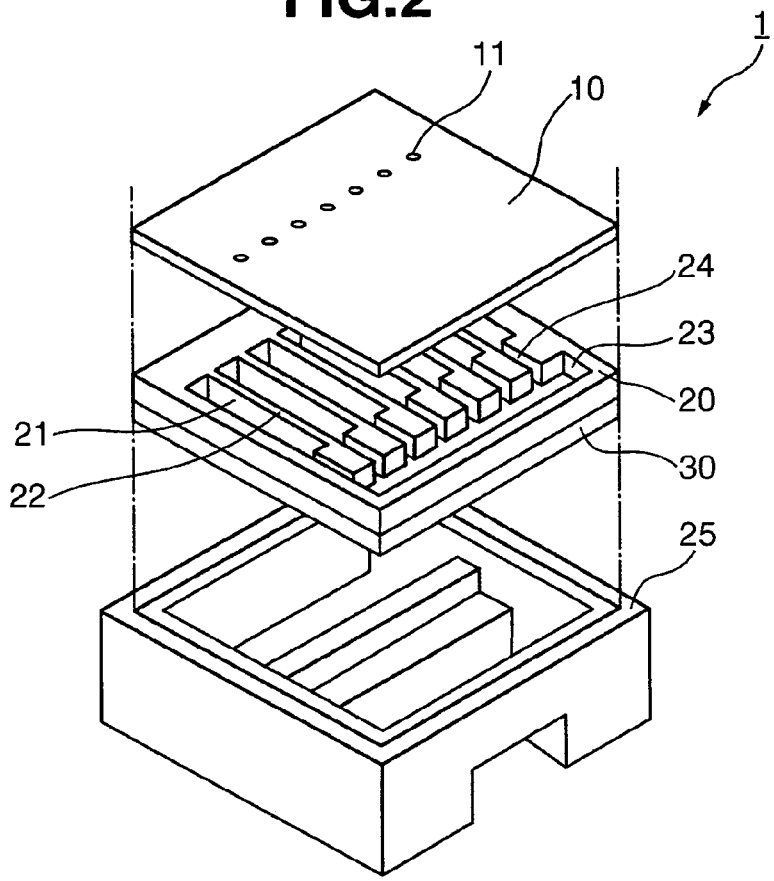
FIG. 2 is an exploded perspective view of an inkjet recording head serving as a liquid jetting head.

FIG. 2 shows an exploded perspective view of the inkjet recording head described above. The inkjet recording head 1 comprises a pressure chamber substrate (Si substrate) 20, a diaphragm 30 which is fixed to one face thereof, and a nozzle plate 10 which is fixed to the other face thereof. This head 1 constitutes an on-demand type piezo jet head.

The pressure chamber substrate 20 comprises pressure chambers (cavities) 21, side walls (partitions) 22, a reservoir 23, and supply ports 24. The pressure chambers 21 are storage spaces for discharging liquid such as ink. The side walls 22 are formed so as to partition the plurality of pressure chambers 21. The reservoir 23 is a common channel for filling each of the pressure chambers 21 with ink. The supply ports 24 are formed to be capable of leading ink into the pressure chambers 21 from the reservoir 23.

The nozzle plate 10 is bonded to the pressure chamber substrate 20 such that nozzles 11 formed therein are disposed in positions which correspond to each of the pressure chambers 21 provided in the pressure chamber substrate 20. The pressure chamber substrate 20 bonded with the nozzle plate 10 is housed inside a casing 25.

A piezoelectric actuator (to be described below) is provided in the diaphragm 30. An ink tank port (not shown) is provided in the diaphragm 30 such that ink stored in the ink tank, not shown in the drawing, can be supplied to the reservoir 23.

(Layer Structure)

Figure 3:
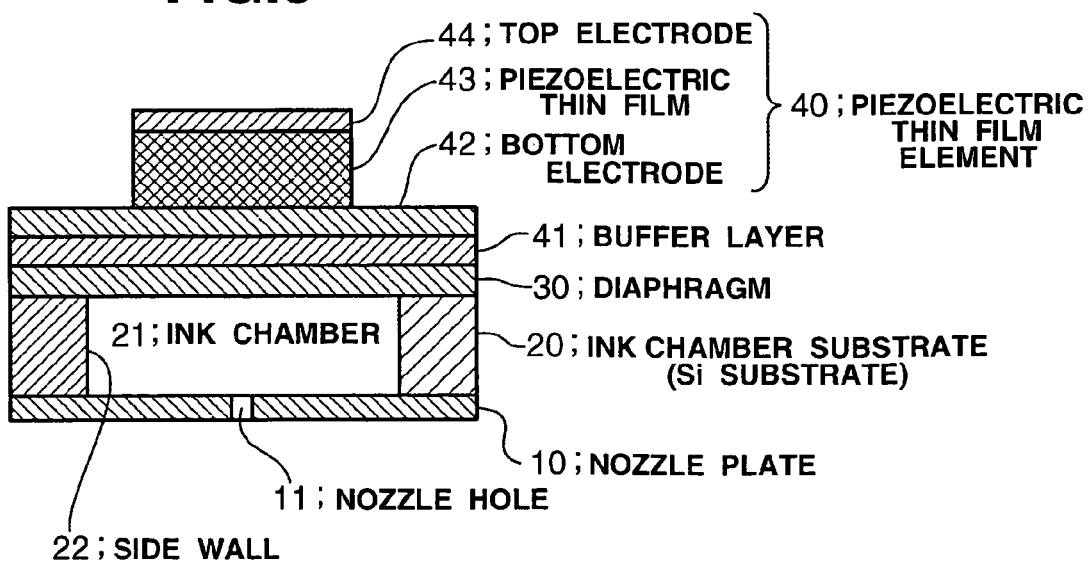
FIG. 3 is a sectional view illustrating the layer structure of the inkjet recording head serving as a liquid jetting head and the piezoelectric actuator manufactured according to a manufacturing method of the present invention.

FIG. 3 is a sectional view illustrating the layer structure of the inkjet recording head and piezoelectric actuator manufactured according to a manufacturing method of the present invention. As shown in the drawing, the piezoelectric actuator is constituted by laminating a diaphragm 30, a buffer layer 41, a bottom electrode 42, a piezoelectric thin film 43, and a top electrode 44 on the (100) orientation Si substrate 20.

The diaphragm 30 functions to momentarily raise the pressure inside the pressure chambers 21 by deforming in accordance with the deformation of the piezoelectric layer. The diaphragm 30 is constituted by yttria-stabilized zirconia, $CeO_2$, or $ZrO_2$ in a cubic (100) orientation having a fluorite structure. The yttria-stabilized zirconia, $CeO_2$, or $ZrO_2$ is easily epitaxially grown in a cubic (100) orientation on the (100) Si substrate, and is also suitable for causing the epitaxial growth of the buffer layer thereabove.

The buffer layer 41 grows epitaxially on the diaphragm 30, and causes the epitaxial growth of the bottom electrode 42 thereabove. The buffer layer 41 is constituted by $REBa_2Cu_3O_x$ (RE=La, Ce, Pr, Nd, Pm, Sm, Eu, Gd, Tb, Dy, Ho, Er, Tm, Yb, Lu, Y), and undergoes epitaxial growth in a tetragonal or orthorhombic (001) orientation. The buffer layer 41 has a layered perovskite structure comprising a two-dimensional network laminated structure of copper and oxygen.

The bottom electrode 42 is one of the electrodes for applying a voltage to the piezoelectric thin film layer 43, and is formed in the same region as the diaphragm 30 in order to function as a common electrode for the plurality of piezoelectric thin film elements formed on the pressure chamber substrate 20. Note, however, that the bottom electrode 42 may also be formed with the same magnitude as the piezoelectric thin film layer 43, or in other words in the same shape as the top electrode. The bottom electrode 42 is constituted by a conductive metal oxide, particularly pseudo-cubic (100) orientation strontium ruthenate (SRO). A structure in which an iridium or platinum layer is interposed between two SRO layers may also be employed. By interposing an iridium or platinum layer between two SRO layers, tenacity is improved and breakage and cracking can be suppressed.

The SRO has a perovskite structure, and is expressed by $Sr_{n+1}Ru_nO_{3n+1}$ (where n is an integer of one or more). When n=1, this becomes $Sr_2RuO_4$, when n=2 this becomes $Sr_3Ru_2O_7$, and when n=∞ this becomes $SrRuO_3$. When SRO is used as the bottom electrode in this embodiment, $SrRuO_3$ is most preferable so that conductivity and crystallinity of the piezoelectric thin film can be enhanced. If the constitution described above, in which an iridium or platinum layer is interposed between two SRO layers, is employed, it is particularly preferable to use $SrRuO_3$ for the SRO on the piezoelectric thin film layer side.

The piezoelectric thin film layer 43 is a piezoelectric ceramic having a perovskite crystalline structure, and is formed in a predetermined shape on top of the bottom electrode 42. As for the composition of the piezoelectric thin film layer 43, lead zirconate titanate (Pb (Zr, Ti) $O_3$: PZT), or a solid solution of lead magnesium niobate and lead titanate PMN-PT and a solid solution of lead zinc niobate and lead titanate PZN-PT, or similar is preferable. The composition is not limited thereto, however, and lanthanum-modified lead titanate ((Pb, La) $TiO_3$), lanthanum-modified lead zirconate ((Pb, La) $ZrO_3$), and so on may also be used. The piezoelectric layer of PZT or the like is preferably of a rhombohedral system and has a (100) orientation.

The top electrode 44 is the other electrode for applying a voltage to the piezoelectric thin film layer 43, and is constituted by a conductive material such as platinum (Pt), iridium (Ir), or aluminum (Al), for example. If aluminum is used, iridium or the like is laminated thereon to prevent electric corrosion.

(Operations of the Inkjet Recording Head)

The operations of the aforementioned inkjet recording head 1 will now be described. When no predetermined discharge signal is supplied and a voltage is not applied between the bottom electrode 42 and top electrode 44 of the piezoelectric thin film element 40, no deformation occurs in the piezoelectric thin film layer 43. When no discharge signal is supplied to the piezoelectric thin film element 40, no pressure change is produced in the pressure chamber 21 in which the piezoelectric thin film element 40 is provided, and thus no liquid droplets are discharged from the nozzle 11 thereof.

However, when a predetermined discharge signal is supplied and a constant voltage is applied between the bottom electrode 42 and top electrode 44 of the piezoelectric thin film element 40, deformation occurs in the piezoelectric thin film layer 43. When a discharge signal is supplied to the piezoelectric thin film element 40, the diaphragm 30 of the pressure chamber 21 in which the piezoelectric thin film element 40 is provided yields greatly. As a result, the pressure inside the pressure chamber 21 rises momentarily, and liquid droplets are discharged from the nozzle 11. By supplying individual discharge signals to piezoelectric elements in positions on the elongated head at which printing is to be performed, desired characters and graphic forms can be printed.

(Manufacturing Method)

Manufacturing processes for the piezoelectric actuator of this embodiment will be described with reference to FIG. 4 in conjunction with a description of the manufacturing processes for the inkjet recording head serving as an example of a liquid jetting head.

Substrate (S1)

Figure 4:
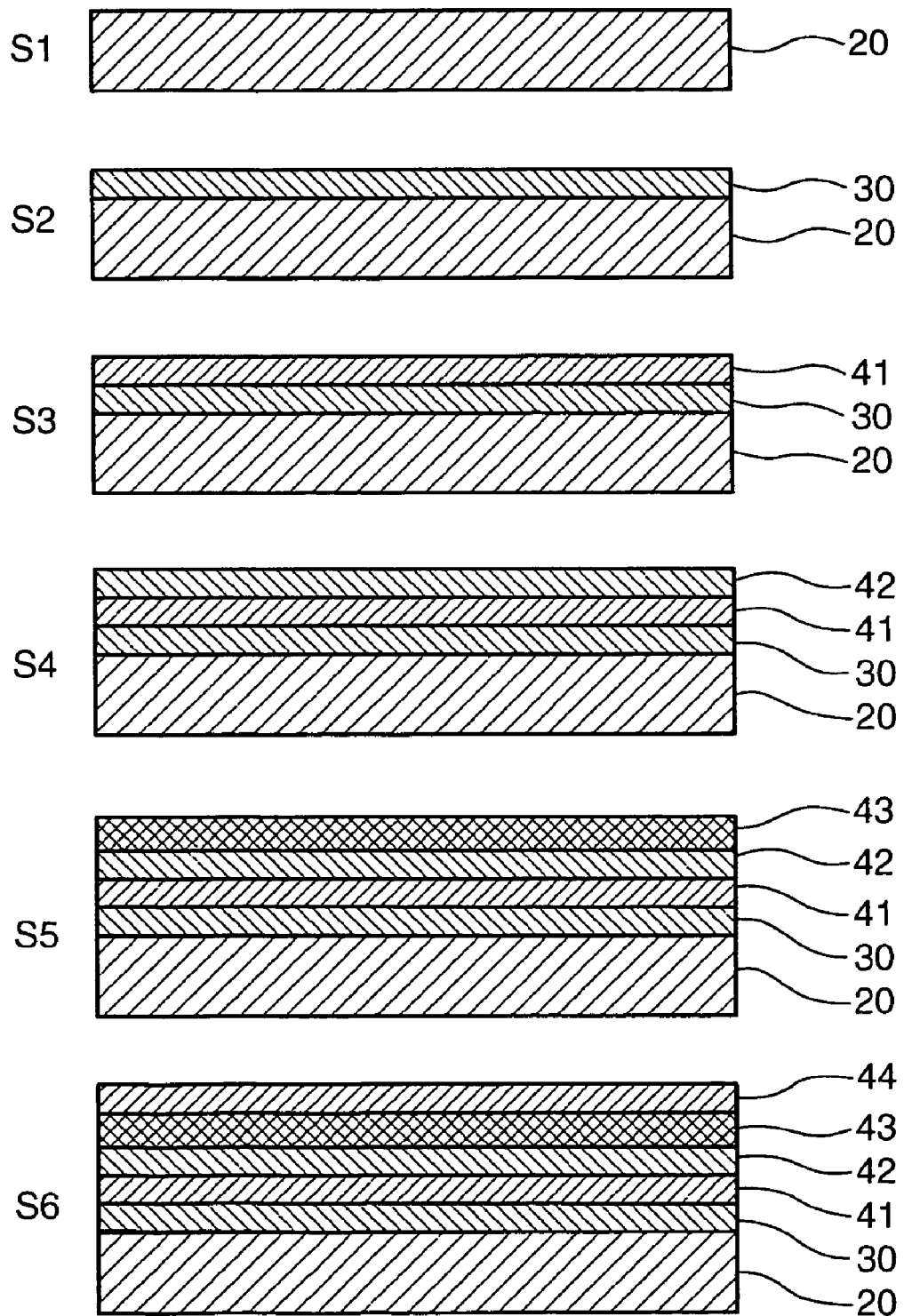
FIG. 4 is a sectional view showing manufacturing processes of the piezoelectric actuator of this embodiment.

The piezoelectric actuator of this embodiment is constituted by depositing the diaphragm 30, buffer layer 41, lower electrode 42, piezoelectric thin film 43, and upper electrode 44 onto the pressure chamber substrate 20 shown in FIG. 4 (S1). A (100) orientation silicon single crystal substrate with a diameter of 100 mm and a thickness of 200 μm, for example, is used as the pressure chamber substrate 20.

Formation of Diaphragm (S2)

As is shown in FIG. 4 (S2), the diaphragm 30 constituted by yttria-stabilized zirconia (YSZ) having a composition of $Zr_{1-x}Y_xO_{2-0.5x}$ ($0 \leq x \leq 1$) or the aforementioned $CeO_2$, $ZrO_2$, or similar is formed on the (100) Si substrate 20 by means of epitaxial growth. Thus a film of YSZ or the like having a (100) orientation is formed.

The YSZ is set to a thickness of no more than 2 μm, for example 1 μm. The method for epitaxially forming the diaphragm 30 may be a laser application method, molecular beam epitaxy (MBE), MOCVD, sputtering, or another method.

Formation of Buffer Layer (S3)

As shown in FIG. 4 (S3), the buffer layer 41 is deposited on top of the diaphragm 30. $REBa_2Cu_3O_x$ (RE=La, Ce, Pr, Nd, Pm, Sm, Eu, Gd, Tb, Dy, Ho, Er, Tm, Yb, Lu, Y) is deposited at a thickness of approximately 10 nm as the buffer layer 41. A laser application method, for example, is employed as the film deposition method. The method is not limited thereto, however, and a well-known thin film manufacturing method such as MOCVD may be employed.

Formation of Bottom Electrode (S4)

As illustrated in FIG. 4 (S4), the bottom electrode 42 is deposited on the buffer layer 41. As the bottom electrode 42, the aforementioned SRO, or a laminated structure of SRO/Pt/SRO or SRO/Ir/SRO is deposited at a thickness of approximately 500 nm. A laser application method, for example, may be used as the film deposition method. The method is not limited thereto, however, and a well-known thin film manufacturing method such as MOCVD may be employed.

Formation of the Piezoelectric Thin Film (S5)

As is next illustrated in FIG. 4 (S5), the piezoelectric thin film 43 is deposited on top of the bottom electrode 42. In this embodiment, a PZT film constituted by a Pb $(Zr_{0.56}Ti_{0.44})$ $O_3$ composition is deposited using a sol-gel process, for example. More specifically, an organometallic compound such as a metal alkoxide is subjected to hydrolysis and polycondensation in a solution system to thereby form a piezoelectric precursor film which is an amorphous film. This is then crystallized by calcination.

The PZT film constituted by a Pb $(Zr_{0.56}Ti_{0.44})$ $O_3$ composition may also be manufactured by an MOD (metal-organic deposition) method. In this case, hydrolysis of the metal alkoxide is suppressed by the action of an alkanolamine such as triethanolamine or diethanolamine, for example. Other than a metal alkoxide combined with an alkanolamine, a metal acetylacetanate which likewise does not generate electrolysis is suitable as an MOD method starting material. When MOD is used, an identical method to the sol/gel method may be employed in the deposition process. In other words, by undergoing a degreasing process, a piezoelectric precursor film is formed, and this precursor film can be crystallized through calcination.

The PZT undergoes crystal growth under the influence of the crystalline structure of the SRO bottom electrode. In this embodiment, PZT is deposited on the (100) orientation SRO, and as a result a PZT thin film having a (100) orientation is formed. The thickness of the piezoelectric thin film layer is set at no less than 0.3 μm and no more than 2 μm, for example.

If the piezoelectric film is formed by PMN-PT, the composition is one in which the crystal system is rhombohedral, and one in which field-induced bending when a voltage is applied to the piezoelectric body is obtained effectively, or more specifically, a composition of (1-x) Pb $(Mg_{1/3}Nb_{2/3})$ $O_3$-x $PbTiO_3$, where x satisfies $0.25 \leq x \leq 0.35$. In particular, x preferably equals 0.3.

If the piezoelectric film is formed by PZN-PT, the composition is one in which the crystal system is rhombohedral, and one in which field-induced bending when a voltage is applied to the piezoelectric body is obtained effectively, or more specifically, a composition of (1-y) Pb $(Zn_{1/3}Nb_{2/3})$ $O_3$-y $PbTiO_3$, where y satisfies $0.035 \leq y \leq 0.055$. In particular, y preferably equals 0.045.

PMN-PT and PZN-PT also form films exhibiting a (100) orientation on the SRO. The thickness of the piezoelectric film is set at no less than 0.3 μm and no more than 2 μm, for example.

Formation of Top Electrode (S6)

As is next illustrated in FIG. 4 (S6), the top electrode 44 is formed on top of the piezoelectric thin film 43. More specifically, platinum (Pt) or the like is deposited as the top electrode 44 at a film thickness of 100 nm by means of DC sputtering.

(Formation of Piezoelectric Actuator)

Figure 5:
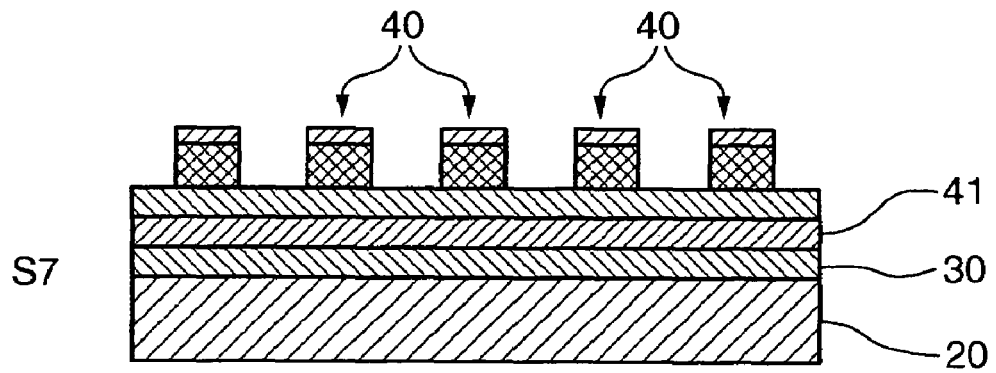
FIG. 5 is a sectional view showing manufacturing processes of the inkjet recording head serving as a liquid jetting head of this embodiment.
Figure 5:
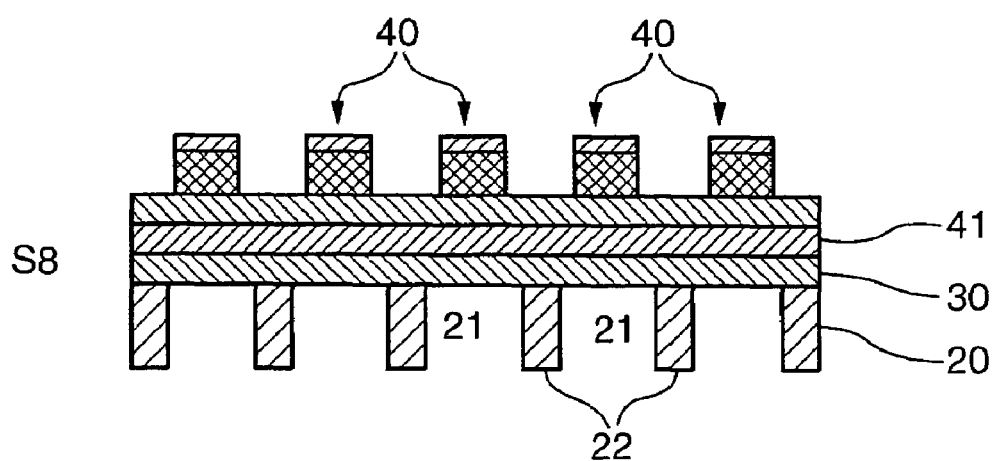
Figure 5:
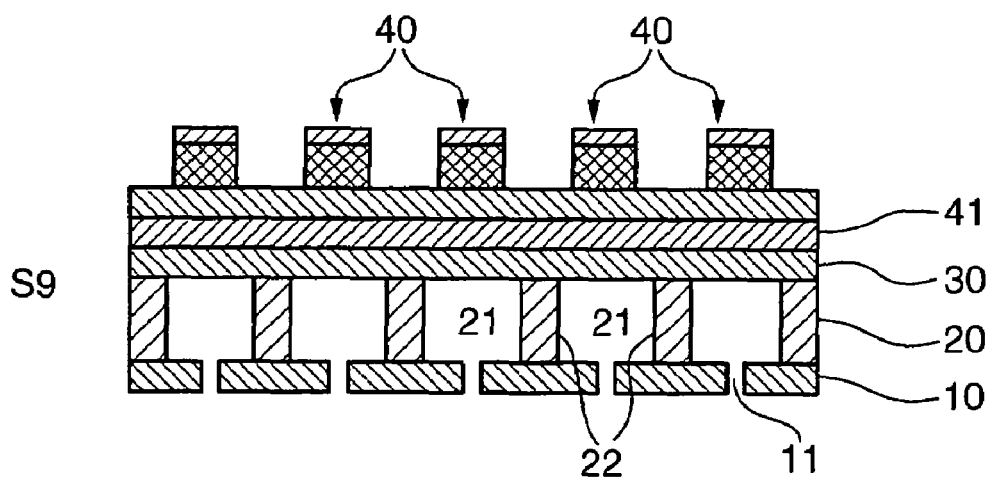

As illustrated in FIG. 5 (S7), the piezoelectric thin film 43 and top electrode 44 are worked into a predetermined shape to form a piezoelectric actuator. More specifically, resist is spin-coated onto the top electrode 44, whereupon the resist is patterned by exposure and development in alignment with the positions at which the pressure chambers are to be formed. With the remaining resist as a mask, the top electrode 44 and the piezoelectric thin film 43 are etched by ion milling or the like. By means of this process, a piezoelectric actuator comprising piezoelectric thin film elements 40 is formed.

(Formation of the Inkjet Recording Head)

As illustrated in FIG. 5 (S8), pressure chambers 21 are formed in the pressure chamber substrate 20. When a (100) orientation Si substrate is used as the pressure chamber substrate 20, dry etching is used as the formation method of the pressure chambers 21. The remaining parts that are not etched become the side walls 22.

Finally, as illustrated in FIG. 5 (S9), the nozzle plate 10 is bonded to the pressure chamber substrate 20 using resin or the like. When the nozzle plate 10 is to be bonded to the pressure chamber substrate 20, the position of the nozzle plate 10 is aligned such that the nozzles 11 are disposed corresponding to each of the spaces in the pressure chambers 21. By means of this process, the inkjet recording head is formed.

(Other Applications)

The present invention may be applied in various modifications other than this embodiment. For example, the piezoelectric actuator of the present invention may be applied not only as the liquid jetting head described above, but as various other actuators such as a precision positioning mechanism such as an STM, a cell manipulator, a probe for an ultrasound diagnostic device, an ultrasonic motor, and a small bimor pump.

The liquid jetting head of the present invention may also be applied to various heads for discharging a liquid other than a head for discharging ink used in an inkjet recording device, for example a head for discharging liquid containing coloring material used in the manufacture of color filters for liquid crystal displays and the like, a head for discharging liquid containing electrode material used to form electrodes for organic EL displays, FEDs (field emission displays), and the like, ahead for discharging liquid containing bioorganic substances used in the manufacture of biochips, and so on.

INDUSTRIAL APPLICABILITY

According to the present invention, a piezoelectric actuator having an optimum layer structure can be provided for a case in which (100) orientation strontium ruthenate is used as a bottom electrode. A liquid jetting head comprising this piezoelectric actuator can also be provided.

The invention claimed is:

1. A piezoelectric actuator characterized in comprising:
   a diaphragm that is constituted by yttria-stabilized zirconia, $CeO_2$, or $ZrO_2$, that is grown epitaxially on a (100) orientation Si substrate in a cubic (100) orientation having a fluorite structure;
   a buffer layer formed on said diaphragm and constituted by tetragonal or orthorhombic (001) orientation $REBa_2Cu_3O_x$ having a layered perovskite structure (RE=La, Ce, Pr, Nd, Pm, Sm, Eu, Gd, Tb, Dy, Ho, Er, Tm, Yb, Lu, Y);
   a bottom electrode formed on said buffer layer and constituted by pseudo-cubic (100) orientation strontium ruthenate having a perovskite structure;
   a piezoelectric layer formed on said bottom electrode and having a rhombohedral (100) orientation perovskite structure; and
   a top electrode formed on said piezoelectric layer.

2. The piezoelectric actuator according to claim 1, characterized in that said bottom electrode comprises at least two layers of strontium ruthenate and a layer of iridium or platinum interposed therebetween.

3. The piezoelectric actuator according to claim 1 or 2, characterized in that of the strontium ruthenate constituting said bottom electrode, at least the layer on the side of said piezoelectric layer has a composition expressed by $SrRuO_3$.

4. The piezoelectric actuator according to any of claims 1 or 2, characterized in that said piezoelectric layer is PZT, PMN-PT, or PZN-PT.

5. A liquid jetting head characterized in comprising:
   the piezoelectric actuator according to any of claims 1 or 2; and
   a pressure chamber provided on said Si substrate and constituting a capacity which is variable in accordance with the oscillation of said diaphragm comprised in said piezoelectric actuator.

6. A liquid jetting device, characterized in comprising the liquid jetting head according to claim 5 as liquid jetting means.

* * * * *